US008802556B2

(12) United States Patent
Bchir et al.

(10) Patent No.: US 8,802,556 B2
(45) Date of Patent: Aug. 12, 2014

(54) BARRIER LAYER ON BUMP AND NON-WETTABLE COATING ON TRACE

(71) Applicant: Qualcomm Incorporated, San Diego, CA (US)

(72) Inventors: Omar J. Bchir, San Marcos, CA (US); Milind P. Shah, San Diego, CA (US); Houssam W. Jomaa, San Diego, CA (US); Manuel Aldrete, San Diego, CA (US); Chin-Kwan Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/771,524

(22) Filed: Feb. 20, 2013

(65) Prior Publication Data

US 2014/0131857 A1 May 15, 2014

Related U.S. Application Data

(60) Provisional application No. 61/726,261, filed on Nov. 14, 2012.

(51) Int. Cl.
*H01L 21/44* (2006.01)
*H01L 23/48* (2006.01)
*H01L 23/52* (2006.01)
*H01L 29/40* (2006.01)

(52) U.S. Cl.
USPC .......................................... 438/614; 257/737

(58) Field of Classification Search
USPC .......................................... 438/614; 257/737
See application file for complete search history.

(56) References Cited

U.S. PATENT DOCUMENTS

| 6,740,577 | B2 * | 5/2004 | Jin et al. ..................... 438/612 |
| 6,774,497 | B1 | 8/2004 | Qi et al. |
| 6,917,119 | B2 * | 7/2005 | Lee et al. ..................... 257/780 |
| 7,485,564 | B2 * | 2/2009 | Daubenspeck et al. ....... 438/613 |
| 8,259,464 | B2 * | 9/2012 | Zhou et al. ................... 361/771 |
| 8,609,526 | B2 * | 12/2013 | Liu et al. ..................... 438/614 |
| 2003/0080420 | A1 * | 5/2003 | Ohara .......................... 257/737 |
| 2005/0239277 | A1 * | 10/2005 | Mercer et al. ................ 438/614 |
| 2007/0166993 | A1 * | 7/2007 | Lee et al. ..................... 438/614 |
| 2008/0277784 | A1 * | 11/2008 | Ozaki et al. .................. 257/737 |
| 2009/0026611 | A1 * | 1/2009 | Lu et al. ....................... 257/737 |
| 2009/0127710 | A1 * | 5/2009 | Daubenspeck et al. ....... 257/737 |
| 2011/0001250 | A1 * | 1/2011 | Lin et al. ...................... 257/778 |
| 2011/0006419 | A1 | 1/2011 | Hirano |
| 2011/0074026 | A1 * | 3/2011 | Shim et al. ................... 257/737 |
| 2011/0101521 | A1 * | 5/2011 | Hwang et al. ................ 257/737 |
| 2011/0101523 | A1 * | 5/2011 | Hwang et al. ................ 257/737 |
| 2011/0193219 | A1 * | 8/2011 | Lai et al. ...................... 257/737 |
| 2011/0260317 | A1 * | 10/2011 | Lu et al. ....................... 257/737 |
| 2011/0285011 | A1 * | 11/2011 | Hwang et al. ................ 257/737 |
| 2011/0298123 | A1 * | 12/2011 | Hwang et al. ................ 257/737 |

(Continued)

*Primary Examiner* — Yu-Hsi D Sun
*Assistant Examiner* — Grant Withers
(74) *Attorney, Agent, or Firm* — Michelle S. Gallardo

(57) ABSTRACT

Some implementations provide a semiconductor device that includes a die, an under bump metallization (UBM) structure coupled to the die, and a barrier layer. The UBM structure has a first oxide property. The barrier layer has a second oxide property that is more resistant to oxide removal from a flux material than the first oxide property of the UBM structure. The barrier layer includes a top portion, a bottom portion and a side portion. The top portion is coupled to the UBM structure, and the side portion is substantially oxidized.

20 Claims, 15 Drawing Sheets

(56) References Cited

U.S. PATENT DOCUMENTS

| | | | |
|---|---|---|---|
| 2011/0304042 A1* | 12/2011 | Lin et al. | 257/737 |
| 2012/0007231 A1* | 1/2012 | Chang | 257/737 |
| 2012/0068334 A1* | 3/2012 | Migita et al. | 257/737 |
| 2012/0091577 A1* | 4/2012 | Hwang et al. | 257/737 |
| 2012/0280388 A1* | 11/2012 | Wu et al. | 257/737 |
| 2013/0134582 A1* | 5/2013 | Yu et al. | 257/737 |
| 2013/0140695 A1* | 6/2013 | Daubenspeck et al. | 257/737 |
| 2013/0228919 A1* | 9/2013 | Choi et al. | 257/737 |
| 2013/0256874 A1* | 10/2013 | Lin et al. | 257/737 |
| 2013/0295762 A1* | 11/2013 | Lu et al. | 438/614 |
| 2013/0307144 A1* | 11/2013 | Yu et al. | 257/737 |
| 2013/0320524 A1* | 12/2013 | Chuang et al. | 257/737 |
| 2014/0035095 A1* | 2/2014 | Lin et al. | 257/528 |
| 2014/0061897 A1* | 3/2014 | Lin et al. | 257/737 |
| 2014/0065729 A1* | 3/2014 | Cho | 438/4 |

* cited by examiner

BARRIER LAYER ON BUMP AND NON-WETTABLE COATING ON TRACE

CLAIM OF PRIORITY

The present application claims priority to U.S. Provisional Application No. 61/726,261 entitled "Barrier Layer on Bump and Non-wettable Coating on Trace", filed Nov. 14, 2012, which is hereby expressly incorporated by reference herein.

FIELD

Various features relate to a barrier layer on bump and non-wettable coating on trace.

BACKGROUND

A thermal compression bonding process is a process used to assemble/package a flip chip, die or semiconductor device to a packaging substrate. Such a flip chip is often referred to as a thermal compression flip chip (TCFC). FIG. 1 illustrates an example of a package that includes a chip/die coupled to a substrate using a thermal compression bonding process. As shown in FIG. 1, a package 100 includes a die/chip 102 that is coupled to a substrate 104. There are several electrical connections 106 and a non-conducting paste (NCP) 108 between the chip 102 and the substrate 104. The electrical connections may be defined by under bump metallization (UBM) structures (e.g., UBM structure 110), solder (e.g., solder 112) and traces (e.g., trace 114). The NCP 108 provides a protective layer that covers the electrical connections between the chip 102 and the substrate 104.

FIG. 2 illustrates an example of how a chip/die may be assembled to a package by using a thermal compression bonding process. Specifically, FIG. 2 illustrates a package 200 and a die 202. The package 202 includes a packaging substrate 204 and several traces 206a-c. FIG. 2 also illustrates a non conductive paste (NCP) 208, which is usually dispensed on top of the traces 206a-c before thermo-compression is done. The NCP 208 may have fluxing capabilities, which means the NCP 208 may be capable of removing oxide from materials (e.g., remove oxide from bumps and/or traces). Oxide is a material layer that may be formed on the surface of an underlying material when the underlying material is exposed to air, water and/or other chemicals. The die 200 includes several bumps 210a-c. Each of the bumps 204a-c respectively includes copper pillars 212a-c and may also include solders 214a-c.

During the thermal compression bonding process a few things may happen that can cause the assembly of the die to the package to fail. In one instance, the solder (e.g., solder 214b) may wet excessively with the side of the bump (e.g., bump 210b) on the die side. Normally, oxide on a material prevents solder to wet (flow and attach) to the material. However, when at least some of the oxide is removed, the solder may wet to the material. During the thermal compression bonding process, excessive wetting of the side of the bump may happen because the NCP 208 that is used removes oxide from the bump (e.g., from the copper pillar), which allows solder to wet to the side of the pillar. Excessive wetting can also occur when the bump is covered with a gold based surface, which has a highly wettable property. This wetting of the side of the pillar may lead to joint starvation. When joint starvation occurs, the resulting connection/joint between the bump, the solder and the trace is open or poor. In an open joint, there is no connection between the bump, the solder and the trace. That is there is a gap between the bump and the trace in some implementations. In a poor joint, the connection between the bump, the solder and the trace is very weak and will likely fail over the life of the die and/or package.

FIG. 3 illustrates a die assembled to a package after a thermal compression bonding process. Specifically, FIG. 3 illustrates the package 200 and the die 202 of FIG. 2 after a thermal compression bonding process. As shown in FIG. 3, the bump 210a is coupled to the trace 206a. Similarly, the bump 210b is coupled to the trace 206b, and the bump 210c is coupled to the trace 206c. As shown in FIG. 3, there is no joint between the bump 210b and the trace 206b, as illustrated by the fact that the most of the solder 214b is on the trace 206b (e.g., because of excessive wetting of the trace 206b) and some of the solder 214b is on the bump 210b, with a gap between the bump 210b and the trace 206b. In contrast, there is a joint between the bump 210a and the trace 206a. Moreover, the solder 214a is in contact with both the trace 206a and the bump 210a without any gap in the solder 214a.

Therefore, there is a need for an improved design to ensure solid joints are created between solder and trace. In addition, such a design will also reduce excessive wetting of traces and/or bumps.

SUMMARY

Various features, apparatus and methods described herein provide a barrier layer on bump and non-wettable coating on trace.

A first example provides a semiconductor device that includes a die, an under bump metallization (UBM) structure coupled to the die, and a barrier layer. The UBM structure has a first oxide property. The barrier layer has a second oxide property that is more resistant to oxide removal from a flux material than the first oxide property of the UBM structure. The barrier layer includes a top portion, a bottom portion and a side portion. The top portion is coupled to the UBM structure and the side portion is substantially oxidized.

According to one aspect, the barrier layer prevents a solder from spreading to a side of the UBM structure during an assembly process of the die to a substrate.

According to an aspect, the barrier layer prevents joint starvation between a solder and a trace during an assembly process of the die to a substrate. In some implementations, the first oxide property defines the oxide stability of the UBM structure and the second oxide property has a lower oxide stability than the first oxide property. In some implementations, the barrier layer is a nickel barrier layer.

According to one aspect, the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides a semiconductor that includes a die, a first interconnect means and a second interconnect means. The first interconnect means is coupled to the die. The first interconnect means has a first oxide property. The second interconnect means has a second oxide property that is more resistant to oxide removal from a flux material than the first oxide property of the first interconnect means. The second interconnect means includes a top portion, a bottom portion and a side portion. The top portion is coupled to the first interconnect means. The side portion is substantially oxidized.

According to an aspect, the second interconnect means having the second oxide property that is more resistant to oxide removal from the flux material than the first oxide of the first interconnect means prevents a solder from spreading to a side of the first interconnect means during an assembly process of the die to a substrate.

According to one aspect, the second interconnect means having the second oxide property that is more resistant to oxide removal from the flux material than the first oxide of the first interconnect means prevents joint starvation between a solder and a trace during an assembly process of the die to a substrate.

According to an aspect, the first oxide property defines the oxide stability of the first interconnect means, the second oxide property having a lower oxide stability than the first oxide property.

According to one aspect, the semiconductor device further includes a solder coupled to the second interconnect means. The semiconductor device also includes a third interconnect means coupled to the solder. The third interconnect means has a first wettable portion and a second oxidized portion, the first wettable portion being the first portion of the third interconnect means that the solder can wet onto, the second oxidized portion being coated with an oxide that prevents the solder from wetting to the second portion of the third interconnect means.

According to one aspect, the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides a method for manufacturing a semiconductor device. The method provides a die. The method provides an under bump metallization (UBM) structure coupled to the die. The UBM structure has a first oxide property. The method provides a barrier layer coupled to the UBM structure. The barrier layer has a second oxide property that is more resistant to oxide removal from a flux material than the first oxide property of the UBM structure. The barrier layer includes a top portion, a bottom portion and a side portion. The top portion is coupled to the UBM structure. The side portion is substantially oxidized.

According to one aspect, the barrier layer prevents a solder from spreading to a side of the UBM structure during an assembly process of the die to a substrate.

According to an aspect, the barrier layer prevents joint starvation between a solder and a trace during an assembly process of the die to a substrate.

A fourth example provides a semiconductor device that includes a substrate; and a trace coupled to the substrate. The trace has a first wettable portion and a second oxidized portion. The first wettable portion is the first portion of the trace that solder can wet onto. The second oxidized portion is coated with an oxide that prevents solder from wetting to the second portion of the trace.

According to one aspect, the second oxidized portion is coated with a nickel oxide. In some implementations, the second oxidized portion is coated with a chromium oxide.

According to an aspect, the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A fifth example provides a semiconductor device that includes a substrate and a first interconnect means coupled to the substrate. The first interconnect means has a first wettable portion and a second oxidized portion. The first wettable portion is the first portion of the first interconnect means that solder can wet onto. The second oxidized portion is coated with an oxide that prevents solder from wetting to the second portion of the first interconnect means. In some implementations, the first interconnect means is a copper trace. In some implementations, the second oxidized portion is coated with a nickel oxide. In some implementations, the second oxidized portion is coated with a chromium oxide.

According to an aspect, the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A sixth example provides a method for manufacturing a semiconductor device. The method providing a substrate. The method also provides a trace coupled to the substrate. The trace has a first wettable portion and a second oxidized portion. The first wettable portion is the first portion of the trace that solder can wet onto. The second oxidized portion is coated with an oxide that prevents solder from wetting to the second portion of the trace.

According to one aspect, the second oxidized portion is coated with a nickel oxide. In some implementations, the second oxidized portion is coated with a chromium oxide.

A seventh example provides a method for assembling a semiconductor package. The method provides a die that includes an under bump metallization (UBM) structure and a barrier layer. The UBM structure has a first oxide property. The barrier layer is coupled to the UBM structure. The barrier layer has a second oxide property that is more resistant to oxide removal from a flux material than the first oxide property of the UBM structure. The barrier layer includes a top portion, a bottom portion and a side portion. The top portion is coupled to the UBM structure. The side portion is substantially oxidized. The method also provides a packaging substrate that includes a trace. The trace include a first wettable portion and a second oxidized portion. The first wettable portion is the first portion of the trace that solder can wet onto. The second oxidized portion is coated with an oxide that prevents solder from wetting to the second portion of the trace. The method further couples the die to the packaging substrate to define the semiconductor package.

According to one aspect, the second oxidized portion is coated with a nickel oxide. In some implementations, the second oxidized portion is coated with a chromium oxide.

A eighth example provides a method for providing a trace on a packaging substrate. The method applies a resist layer on a portion of the trace. The method coats an exposed portion of the trace with an oxide. The oxide prevents solder from wetting to the coated portion of the trace. The method removes the applied resist layer.

According to one aspect, coating the exposed portion of the trace includes oxidizing the exposed portion. In some implementations, coating the exposed portion of the trace includes plating the exposed portion with a coating material having an oxide property that is more resistant to oxide removal from the flux material than the oxide of the trace. The plated material include an oxide in some implementations. In some implementations, the coating material is a nickel oxide. In some implementations, the coating material a chromium oxide.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some exemplary implementations of this disclosure pertain to a semiconductor device that includes a die, an under bump metallization (UBM) structure coupled to the die, and a barrier layer. The UBM structure has a first oxide property. The barrier layer has a second oxide property that is more resistant to oxide removal from a flux material than the first oxide property of the UBM structure. The barrier layer includes a top portion, a bottom portion and a side portion. The top portion is coupled to the UBM structure, and the side portion is substantially oxidized. In some implementations, the barrier layer prevents a solder from spreading to a side of the UBM structure (e.g., first interconnect means) during an assembly process of the die to a substrate. In some implementations, the barrier layer prevents joint starvation between a solder and a trace during an assembly process of the die to a substrate. In some implementations, the barrier layer (e.g., second interconnect means, barrier means) is a nickel barrier layer.

Some exemplary implementations of this disclosure pertain to a semiconductor device that includes a substrate; and a trace coupled to the substrate. The trace has a first wettable portion and a second oxidized portion. The first wettable portion is the first portion of the trace that solder can wet onto. The second oxidized portion is coated with an oxide that prevents solder from wetting to the second portion of the trace. In some implementations, the second oxidized portion is coated with a nickel oxide. In some implementations, the second oxidized portion is coated with a chromium oxide.

Exemplary Barrier Layer on Bump

Figure 4:
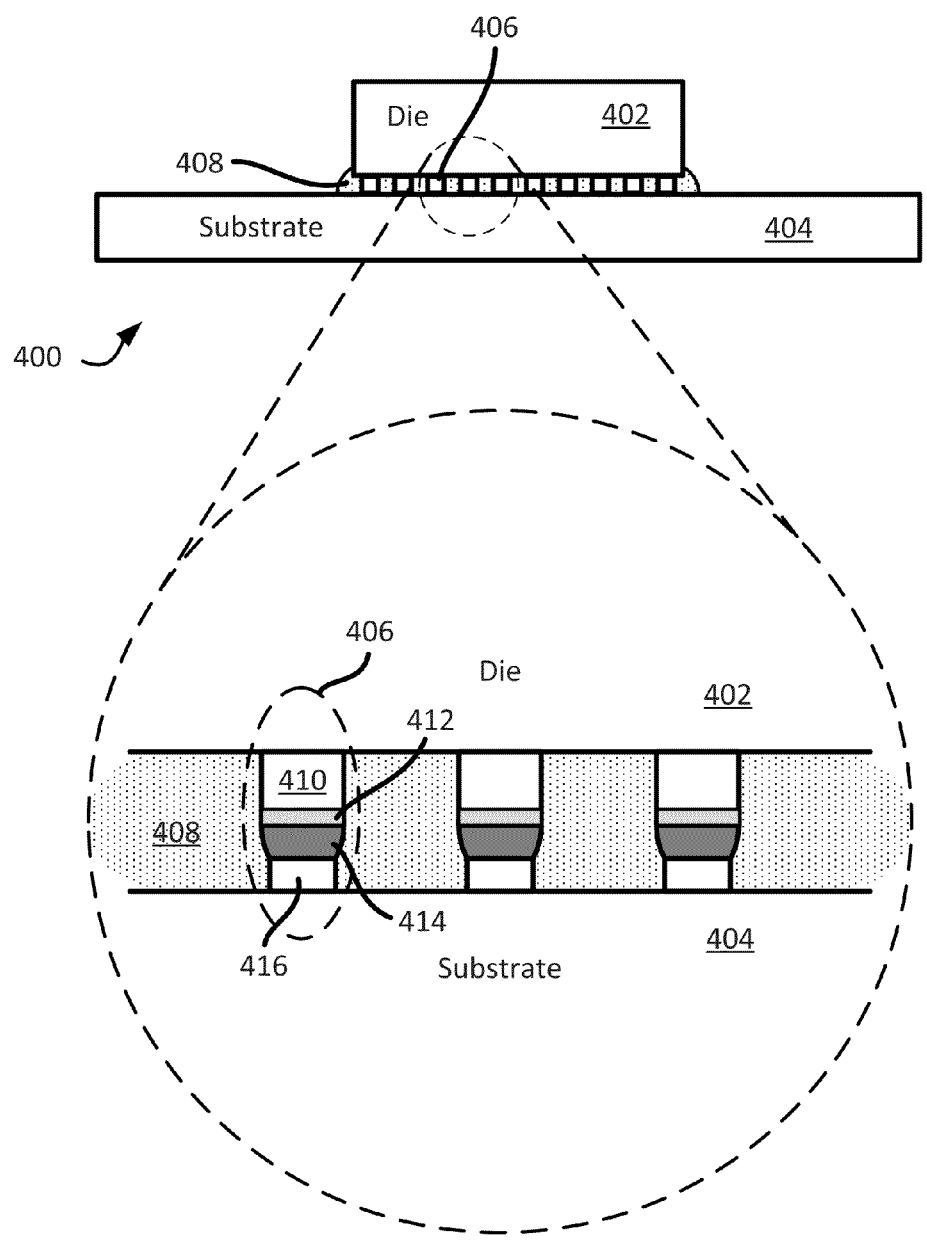
FIG. 4 illustrates a thermal compression flip chip with bumps having a barrier layer coupled to a packaging substrate.

FIG. 4 illustrates an example of a package that includes a die coupled to a substrate, where the die includes a bump having a barrier layer. As shown in FIG. 4, a package 400 includes a die 402 that is coupled to a substrate 404. There are several electrical connections (e.g., electrical connection 406) and a non-conducting paste (NCP) 408 between the die 402 and the substrate 404. The NCP 408 provides a protective layer that covers the electrical connections between the die 402 and the substrate 404. The NCP 108 may also provide fluxing capabilities in some implementations. The fluxing capability of a material may refer a material's (e.g., NCP) ability to remove oxide from another material in some implementations. Different materials may have different may have different ability to remove oxide. Some materials are more effective than others at removing oxide.

As shown in FIG. 4, the electrical connection 406 may be defined by a first component 410, a second component 412, a third component 414 and a fourth component 416. The first component 410 may be an under bump metallization (UBM) structure (e.g., pillar). The UBM structure may be a copper material. As such, the first component 410 may be a copper pillar. In some implementations, the UBM structure is a first interconnect means.

The second component 412 may be a barrier layer that provides a layer that prevents solder from wetting the side of the UBM structure in some implementations, which may result in better, stronger joints between a die and a substrate. In some implementations, the second component 412 may be a barrier layer made of material that forms an oxide/oxide layer (e.g. when exposed to air, water and/or other chemicals) that is harder to remove than the oxide/oxide layer on copper. In some implementations, the material of the barrier layer is a material that is more resistant to fluxing capabilities of a paste (e.g., NCP 408) than the material of the first component 410 (e.g., copper UBM structure). In some implementations, the barrier layer is a second interconnect means and/or barrier means. In some implementations, the second component 412 is made of a nickel material. The nickel material may form an oxide/oxide layer (e.g., when exposed to air, water and/or other chemicals) that is harder to remove than oxide/oxide layer on copper (e.g., more resistant to fluxing material) in some implementations. This characteristic of the material may be referred to as an oxide property. In some implementations, this oxide property of the material is an oxide stability that defines the ease of removing the oxide/oxide layer from the underlying material. As mentioned above, this oxide/oxide layer may prevent solder from wetting the side of the first component 410 (e.g., copper UBM structure) in some implementations.

The second component 412 may include a top portion (e.g., top surface portion), a bottom portion (e.g., bottom surface portion), and a side portion (e.g., side surface portion). The top portion of the second component 412 may be coupled to the first component 410. The bottom portion of the second component 412 may be coupled to a third component 414 (e.g., solder), which is further described below. The side portion of the second component 412 may be defined as the perimeter portion and/or circumference portion of the second component 412. Different implementations of the second component 412 (e.g., barrier layer) may be oxidized differently. For example, in some implementations, only some portion of the second component 412 may be oxidized (e.g., may have oxide/oxide layer). In some implementations, the side portion of the second component 412 may have an oxide/oxide layer. The oxide/oxide layer may cover a majority of, substantially all, or completely the side portion of the second component 412 in some implementations. When an oxide/oxide layer is present on the side portion of the second component 412, the side portion may be referred to as a non-wettable portion of the second component 412. The top and bottom portions of the second component 412 may be substantially or completely free of any oxide/oxide layer in some implementations. This may be the case in order for the second component 412 to be able to couple to the first component 410 (e.g., copper pillar) and the third component 414 (e.g., solder).

The third component 414 may be a solder that couples the second component 414 to the fourth component 416. The fourth component 416 may be a trace of a packaging substrate in some implementations. As will be further described below, the fourth component 416 (e.g., trace) may include a first portion that has an oxide/oxide layer and a second portion that is substantially or completely free of any oxide/oxide layer. In some implementations, the second portion that is substantially or completely free of any oxide/oxide layer is the portion of the fourth component 416 that the third component 414 may be coupled to during an assembly process that couples the die 400 to the substrate 404. In some implementations, the second portion of the fourth component 416 may be referred to as the wettable portion of the fourth component 416, since solder may be couple to the second portion. The first portion of the fourth component 416 may be referred to as the non-wettable portion since the oxide/oxide layer on the material (e.g., copper) prevents solder from coupling to the material.

Having described the various components of an electrical connection between a die and a substrate, an exemplary sequence for assembling a die (that includes a bump having a barrier layer) to a substrate will now be described.

Figure 5:
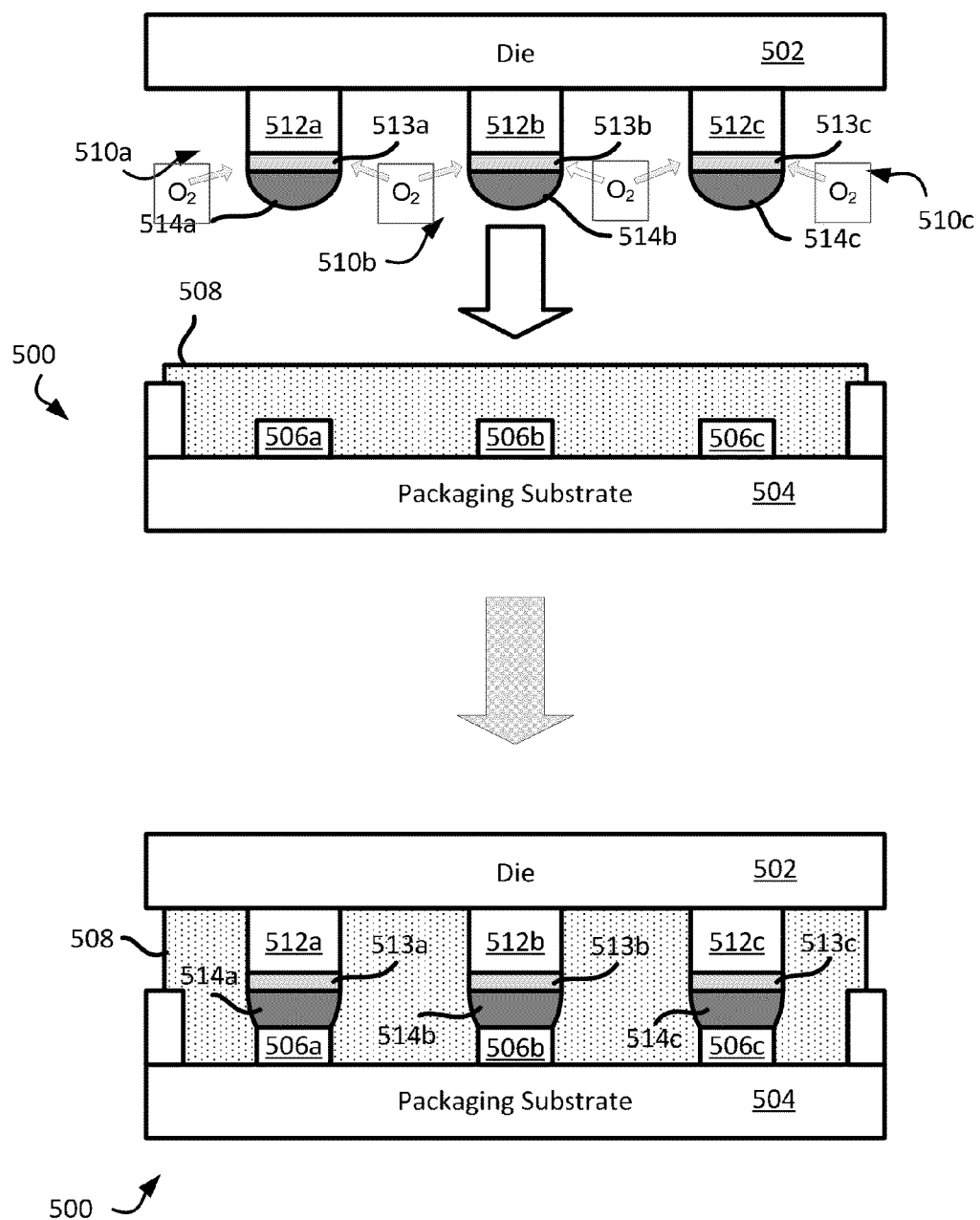
FIG. 5 illustrates a thermal compression flip chip with bumps having a barrier layer being attached to a packaging substrate.

FIG. 5 illustrates an example of how a die may be assembled to a package by using a thermal compression bonding process. Specifically, FIG. 5 illustrates a package 500 and a die 502. The package 502 includes a packaging substrate 504 and several traces 506a-c. FIG. 5 also illustrates a non conductive paste (NCP) 508, which is usually dispensed on top of the traces 506a-c before thermo-compression is done. The NCP 508 has fluxing capabilities, and thus is capable of removing oxide from materials (e.g., remove oxide from bumps and/or traces). The die 500 includes several bumps 510a-c.

Each of the bumps 504a-c respectively includes UBM structures (e.g., copper pillars) 512a-c, barrier layers 513a-c, and may also include solders 514a-c. In some implementations, the UBM structure is a first interconnect means. In some implementations, the barrier layer is a second interconnect means and/or barrier means.

As further shown in FIG. 5, the bump 510a (which includes the UBM structure 512a, barrier layer 513a, and solder 514a) is coupled to the trace 506a. Similarly, the bump 510b (which includes the UBM structure 512b, barrier layer 513b, and solder 514b) is coupled to the trace 506b, and the bump 514c (which includes the UBM structure 512c, barrier layer 513c, and solder 514c) is coupled to the trace 506c. As shown in FIG. 5, all the joints between the solder 514a-c and the traces 506a-c are good and/or strong, as illustrated by the fact that the solder 514a-c are in good contact with a substantial portion/part of the traces 506a-c. There is no excessive solder wetting on the side of the bumps 510a-c. Again, in some implementations, this is the result of using the barrier layers 513a-c, which are made of material that forms an oxide/oxide layer that is harder to remove than an oxide/oxide layer on copper. As discussed above, the oxide/oxide layer is what prevents the solder from wetting the side of the bumps 510a-c in some implementations.

Exemplary Method for Manufacturing Die Having a Bump with a Barrier Layer

Figure 6:
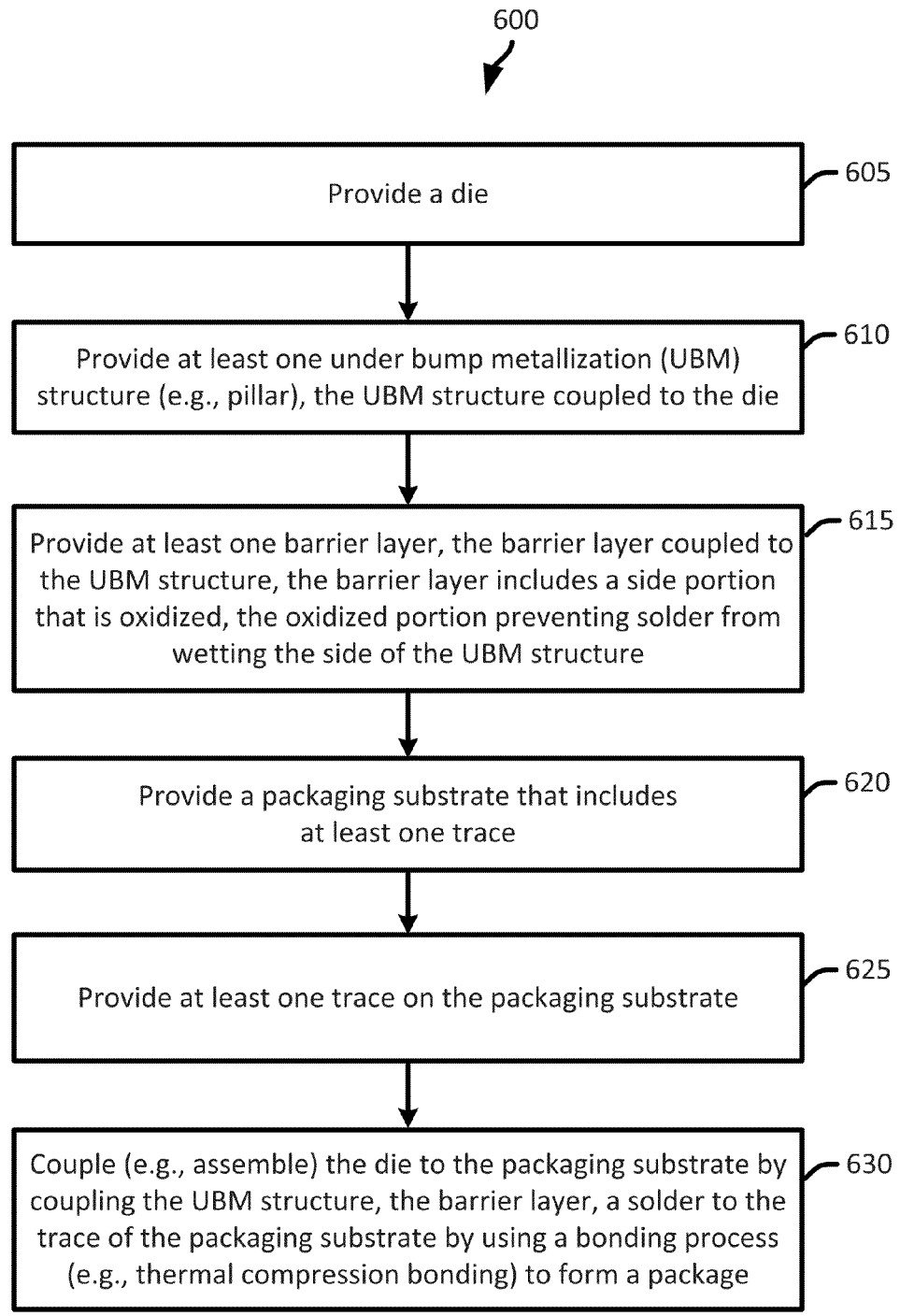
FIG. 6 illustrates a flow diagram of a method for manufacturing a die that includes a bump having a barrier layer.

FIG. 6 illustrates a flow diagram for a method of manufacturing a die that includes a bump that has a barrier layer. The method provides (at 605) a die. In some implementations, providing a die include manufacturing a die. Providing a die may include providing active and passive components of die, including providing metal and dielectric layers of a die. Next, the method provides (at 610) at least one under bump metallization (UBM) structure. In some implementations, the UBM structure is a first interconnect means. The UBM structure may be for example, the UBM structure 410 shown in FIG. 4. The UBM structure may be a copper pillar in some implementations. After providing (at 610) the UBM structure, the method provides (at 615) a barrier layer, which is coupled to the UBM structure. In some implementations, each UBM structure may include a barrier layer. The barrier layer may be for example, barrier layer 412 of FIG. 4. The barrier layer may have a top portion, a bottom portion and a side portion. In some implementations, the barrier layer is a second interconnect means and/or barrier means. The top portion may be coupled to the UBM structure. The side portion may be partially, substantially, or completely oxidized (e.g., may have an oxide/oxide layer). The oxidized portion may prevent solder from wetting to the side of the UBM structure during an assembly process (e.g., during thermal compression bonding process) of a die to a substrate in some implementations.

Next, the method provides (at 620) a packaging substrate. Providing a packaging substrate may include manufacturing a packaging substrate. The packaging substrate may be for example, the substrate 404 of FIG. 4. After providing (at 620) the packaging substrate, the method provides (at 625) at least one trace on the packaging substrate. The traces may be made of a copper material. The trace may be for example, the trace 416 of FIG. 4. In some implementations, some or all portions of at least some of the traces may be coated/oxidized (which will be further described below). That is, some or all portions of at least some of the traces on the packaging substrate may include an oxide layer. In one example, the providing (at 625) the at least one trace includes providing a trace having a first wettable portion and a second oxidized portion. The first wettable portion is a portion of the trace that a solder can wet onto. The second oxidized portion is coated with an oxide/oxide layer that prevents solder from wetting to the second portion of the trace.

After providing (at 625) the trace, the method couples (at 630) the die to the packaging substrate by coupling the UBM structure, the barrier layer, and a solder to the trace of the packaging substrate and ends. The die may be coupled to the packaging substrate by using a thermal compression bonding procession in some implementations. The barrier layer is coupled to the UBM structure to prevent the solder from wetting a side of the UBM structure during the bonding process in some implementations. In some implementations, coupling the die to the packaging substrate includes coupling several UBM structures, barrier layers, and solders to several traces.

As described above, in some implementations, a portion of at least some of the traces may be coated/oxidized (e.g., may have an oxide/oxide layer). Such traces having an oxide/oxide layer will be further described below.

Exemplary Coating/Oxidizing of Traces

Figure 7:
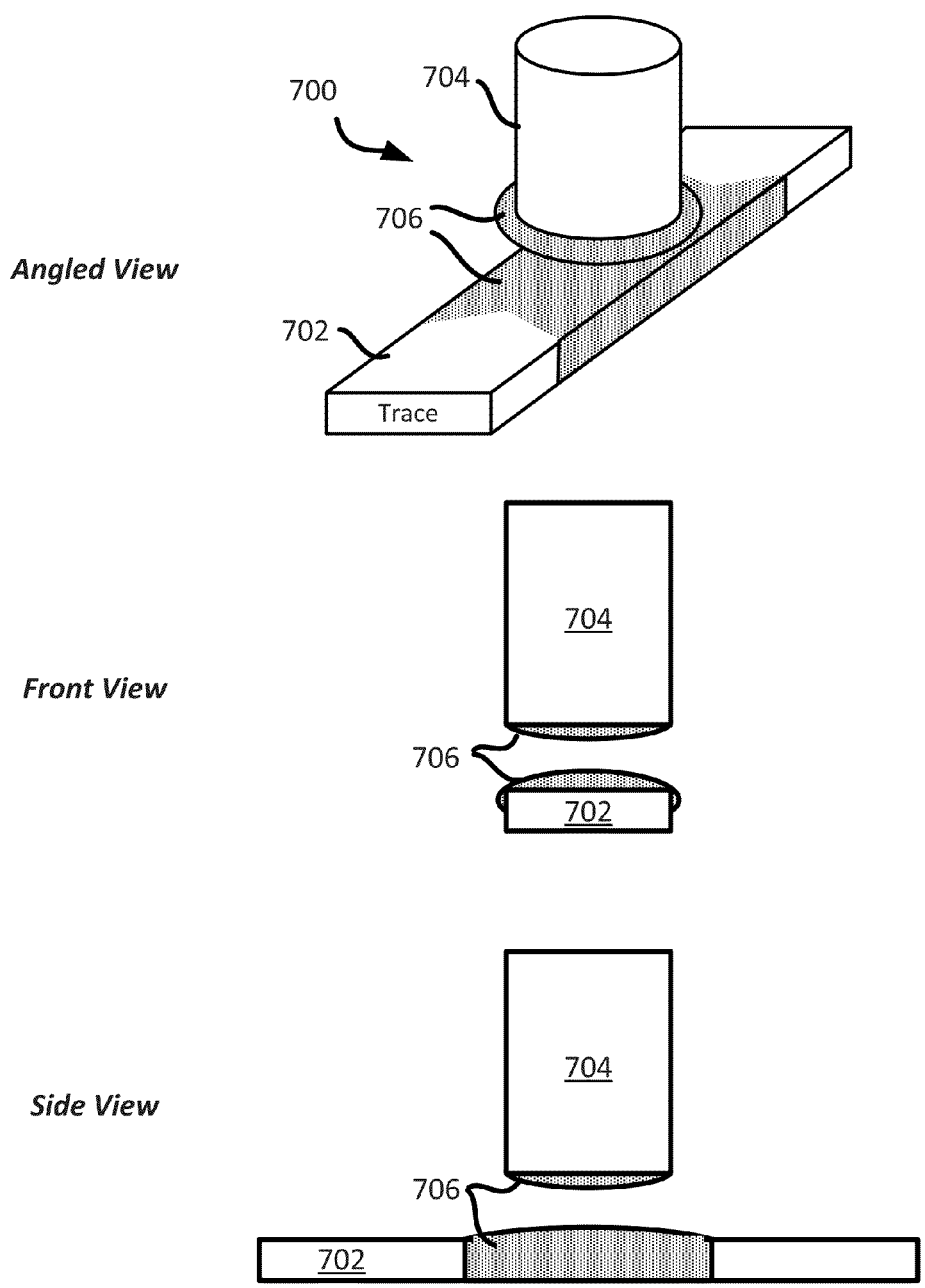
FIG. 7 illustrates the excessive wetting of a solder on a trace.

In some implementations, excessive wetting is not limited to bumps on a die. Excessive wetting can also occur on a trace. More specifically, the solder may wet excessively with a trace in the lateral direction. FIG. 7 illustrates an example of solder that has wet excessively with the trace of on a packaging substrate. Excessive wetting of the trace should be avoided because it can lead to solder starvation from the joint and cause a poor or open joint (e.g., gap) between the chip and the package, as described above. More specifically, FIG. 7 illustrates excessive wetting of a trace resulting in an open joint (e.g., gap) between the trace and a UBM structure, from an angled view, a front view and a side view.

Figure 1:
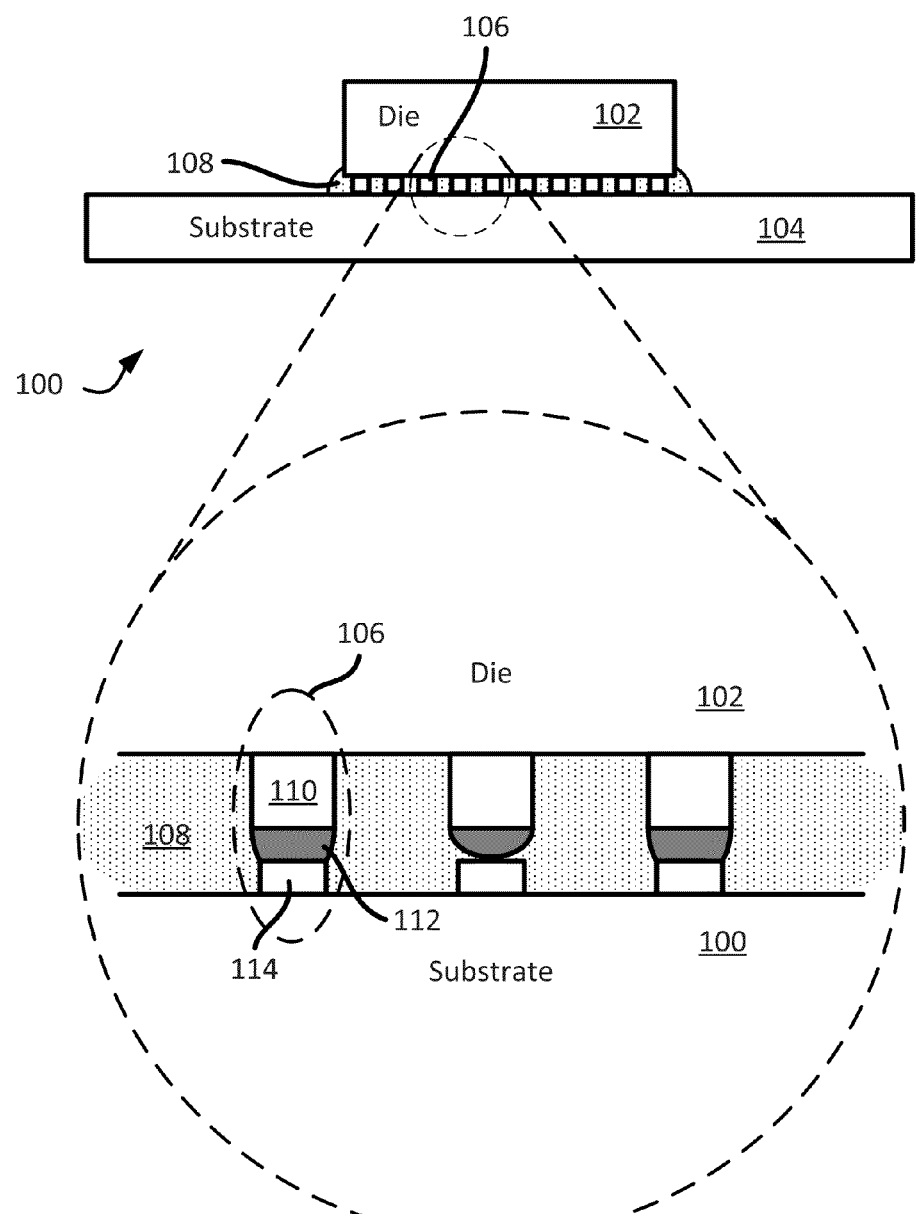
FIG. 1 illustrates a thermal compression flip chip coupled to a packaging substrate.
Figure 2:
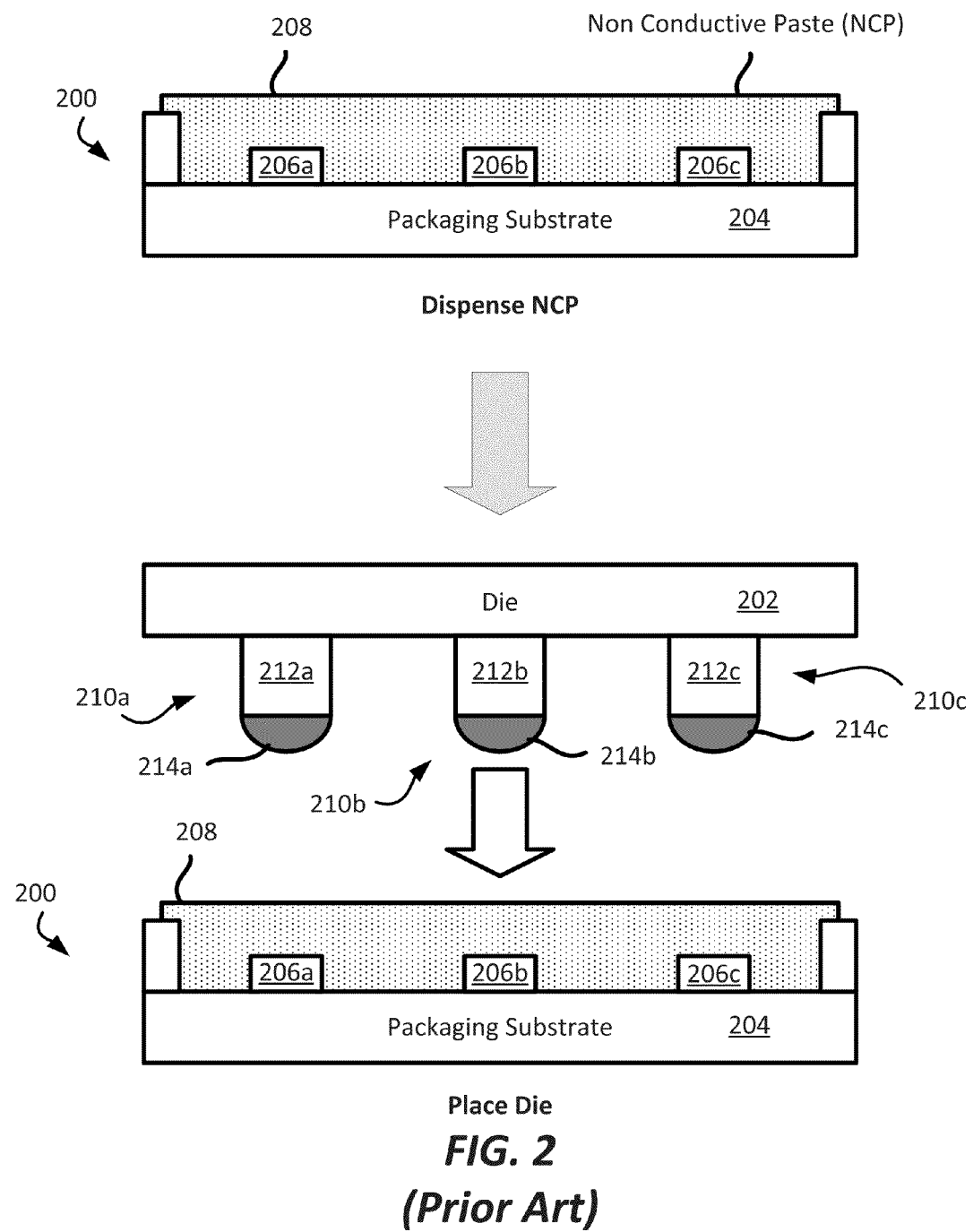
FIG. 2 illustrates a thermal compression flip chip being attached to a packaging substrate.
Figure 3:
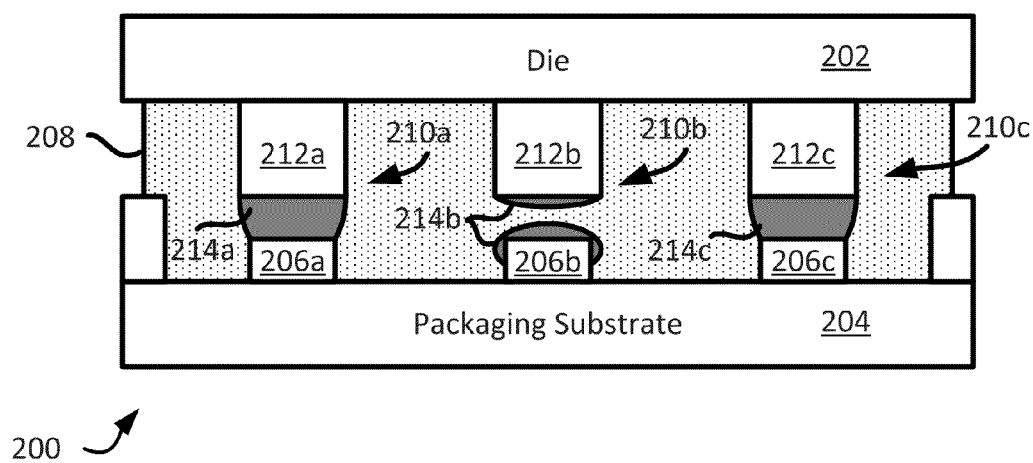
FIG. 3 illustrates a thermal compression flip chip coupled to a packaging substrate, where at least one joint between the flip chip and the packaging substrate is a poor joint.

FIG. 7 illustrates a bump 700 and a trace 702. The bump 700 includes a UBM structure (e.g., pillar) 704 and a solder 706. Specifically, FIG. 3 illustrates the solder 706 wetting excessively on the trace 702, potentially leading to an open joint (e.g., gap) between the UBM structure 704 and the trace 702 due to solder starvation. This is especially possible as the pitch and/or spacing between the traces have gotten smaller, finer and narrower in recent years. To reduce excessive wetting on a trace, some implementations may coat/oxide a portion of a trace to prevent solder from wetting that portion of the trace.

Figure 8:
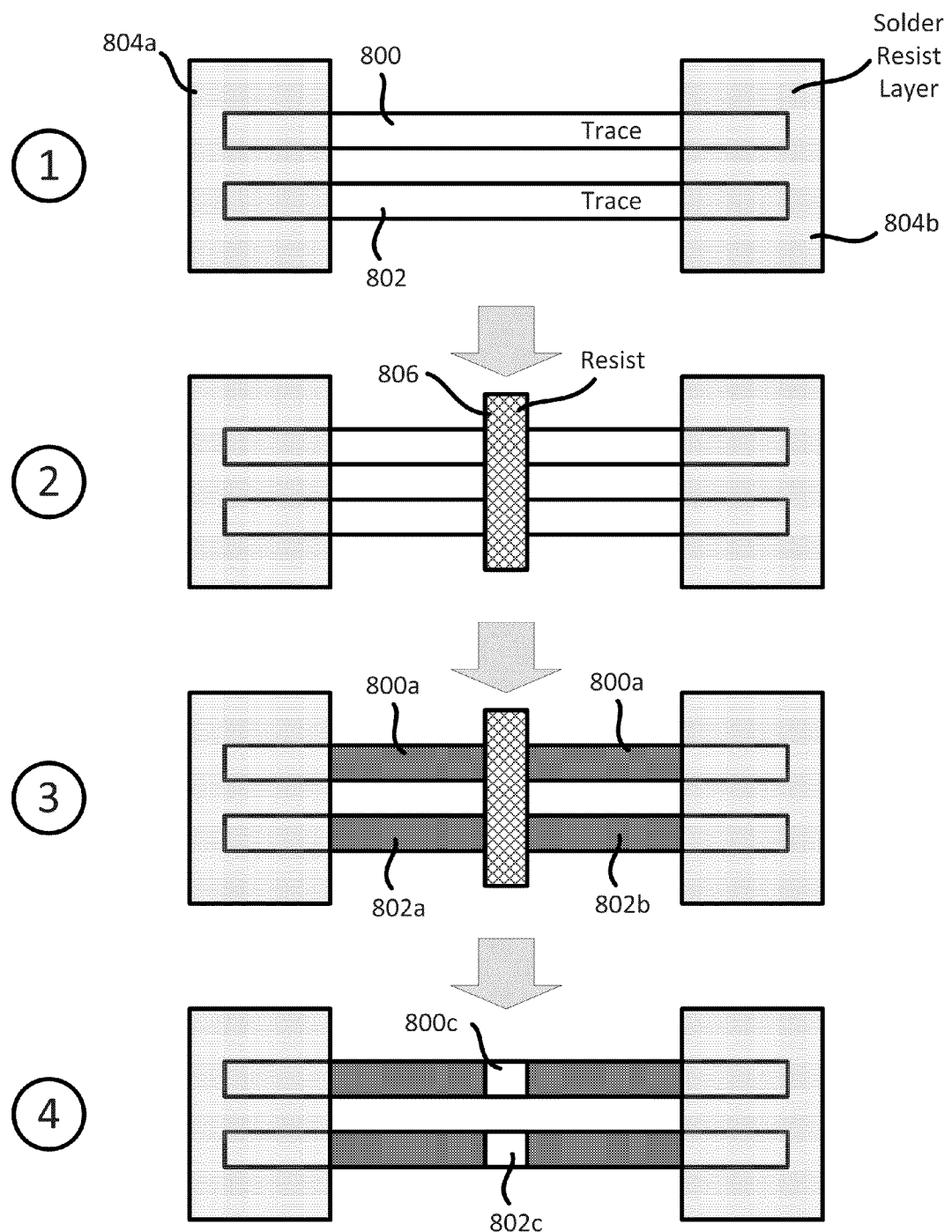
FIG. 8 illustrates a sequence for creating a wettable and non-wettable portion of a trace on a packaging substrate.

FIG. 8 illustrates a sequence of how a trace can be coated to prevent solder from excessively wetting the trace, or at least a portion of the trace. In some implementations, the trace is a first interconnect means. Stage 1 of FIG. 8 illustrates a first trace 800 and a second trace 802. The first trace 800 and the second trace 802 are located on top of a packaging substrate (not shown). The first trace 800 and the second trace 802 are copper traces in some implementations. A first portion of the first trace 800 and a first portion the second trace 802 are covered with a solder resist layer 804a. Stage 1 of FIG. 6 also illustrates that a second portion of the first trace 800 and a second portion the second trace 802 are covered with a solder resist layer 804b. In some implementations, the solder resist layers 804a-b may be a dry film resist or a non-wettable polymer (e.g., polystyrene). The solder resist layers 804a-b protect areas of the packaging substrate (not shown) and/or traces from the solder during the thermal compression process in some implementations.

Stage 2 of FIG. 8 illustrates a resist layer 806 that is applied to a third portion of the first trace 800 and a third portion of the second trace 802. The resist layer 806 may be a dry film resist or a non-wettable polymer (e.g., polystyrene). In some implementations, the third portion of the first trace 800 and the third portion of the second trace 802 correspond to portions of the trace that solder will be coupled to during an assembly process (e.g., thermal compression bonding process) coupling a die to a substrate.

Stage 3 of FIG. 8 illustrates portions 800a-b of the first trace 800 and portions 802a-b of the second trace 802 that have been coated with a non-wettable material. Specifically, any portion of the trace 800 and the trace 802 that is not covered with a resist (e.g., resist 804a-b, 806) is coated with a non-wettable material. In some implementations, the non-wettable material is an oxide layer/oxidized layer of copper. The oxidized layer of copper may be created by exposing the copper material of the trace to air, water, and/or other chemicals. This oxidized layer may be a non-wettable material since it may prevent solder from wetting to the trace. In some implementations, any portion of the first trace 800 and the second trace 802 that is not covered with a resist may be plated with a particular material (e.g., nickel, chromium) and the material is oxidized (by exposing it to air, water and/or other chemicals), which creates an oxide/oxidized layer on the surface of the material. This oxidized material is a non-wettable material that may prevent solder from wetting to the trace.

Stage 4 of FIG. 8 illustrates the traces 800-802 after the resist layer 806 is removed from the third portion of the first trace 800 and the third portion of the second trace 802. As shown in Stage 4, removing the resist layer 806 exposes the third portion 800c of the first trace 800 and the third portion 802c of the second trace 802 thereby allow solder to be wetted to the first trace 800 and the second 802. Specifically, the solder would wet to the third portion 800c of the first trace 800 and the third portion 802c of the second trace 802.

Having described a sequence for coating a trace with a non-wettable layer, a method for coating a trace with a non-wettable layer (e.g., oxidized layer) will now be described.

Exemplary Method for Coating/Oxidizing a Trace with a Non-Wettable Layer

Figure 9:
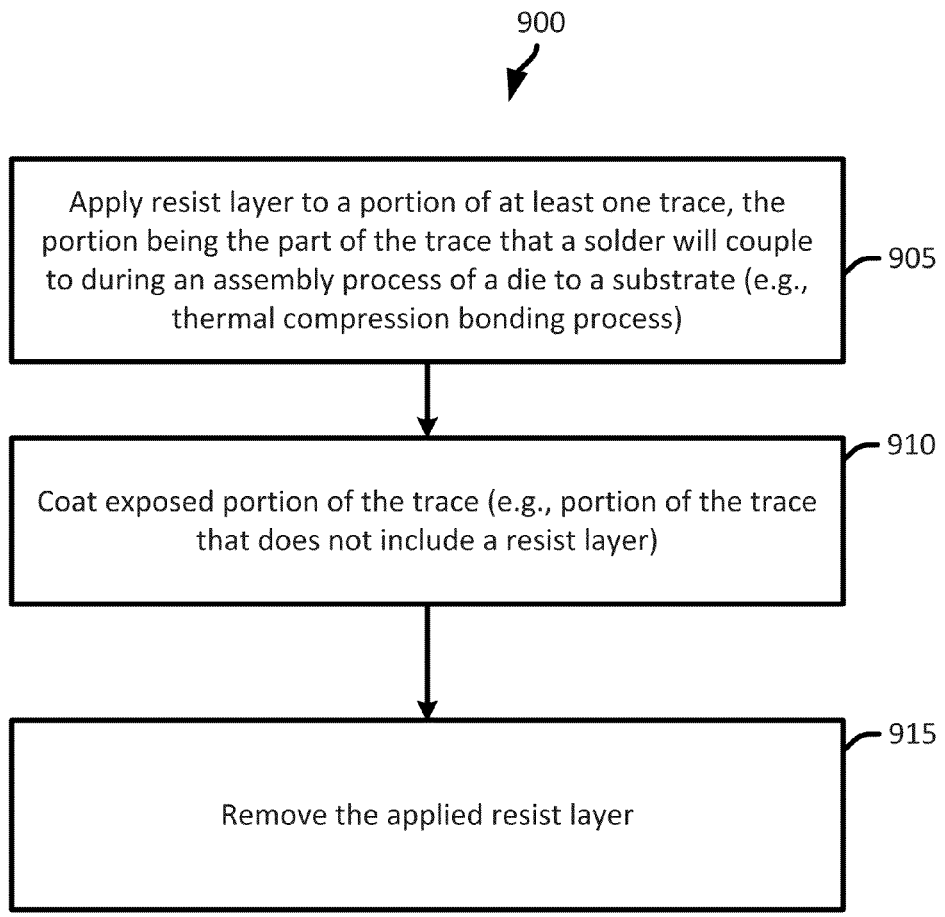
FIG. 9 illustrates a flow diagram of a method for creating a wettable and non-wettable portion of a trace on a packaging substrate.

FIG. 9 illustrates a flow diagram of a method for coating a trace with a non-wettable layer. As shown in FIG. 9, the method applies (at 905) a resist layer to a portion of at least one trace of a packaging substrate. The portion of the trace that the resist layer is applied to may be the part of trace that a solder will couple to during an assembly process of a die to a packaging substrate in some implementations. The assembly process may be a thermal compression bonding process. The resist layer may be a dry film resist and/or a non-wettable polymer (e.g., polystyrene).

Next, the method coats (at 910) exposed portions (e.g., portions not covered by resist) of the trace (e.g., first interconnect means) with a non-wettable layer/material. In some implementations, the non-wettable layer is an oxide layer/oxidized layer of the trace material (e.g., copper). The oxidized layer of the trace may be created by exposing the trace material to air, water, and/or other chemicals. This oxidized layer may be a non-wettable material since it may prevent solder from wetting to the trace. In some implementations, coating (at 910) portions of the trace may include plating portions of the trace with a particular material (e.g., nickel, chromium) and oxidizing the particular material (by exposing it to air, water and/or other chemicals), which creates an oxide/oxidized layer on the surface of the particular material. This oxidized material is a non-wettable material that may prevent solder from wetting to the trace.

After coating (at 910) portions of the trace, the method removes (at 915) the applied resist layer and ends. In some implementations, when the resist layer is removed, the trace may be left with a portion that is partially, substantially or completely free of any oxide/oxide layer in some implementations. This portion of trace that is partially, substantially or completely free of any oxide is the portion that a solder will be coupled to during an assembly process of a die to a substrate in some implementations.

Having described a method for coating a trace with a non-wettable layer, a sequence for coating a trace with non-wettable layer and coupling to a under bump metallization (UBM) structure and solder will now be described below.

Figure 10A:
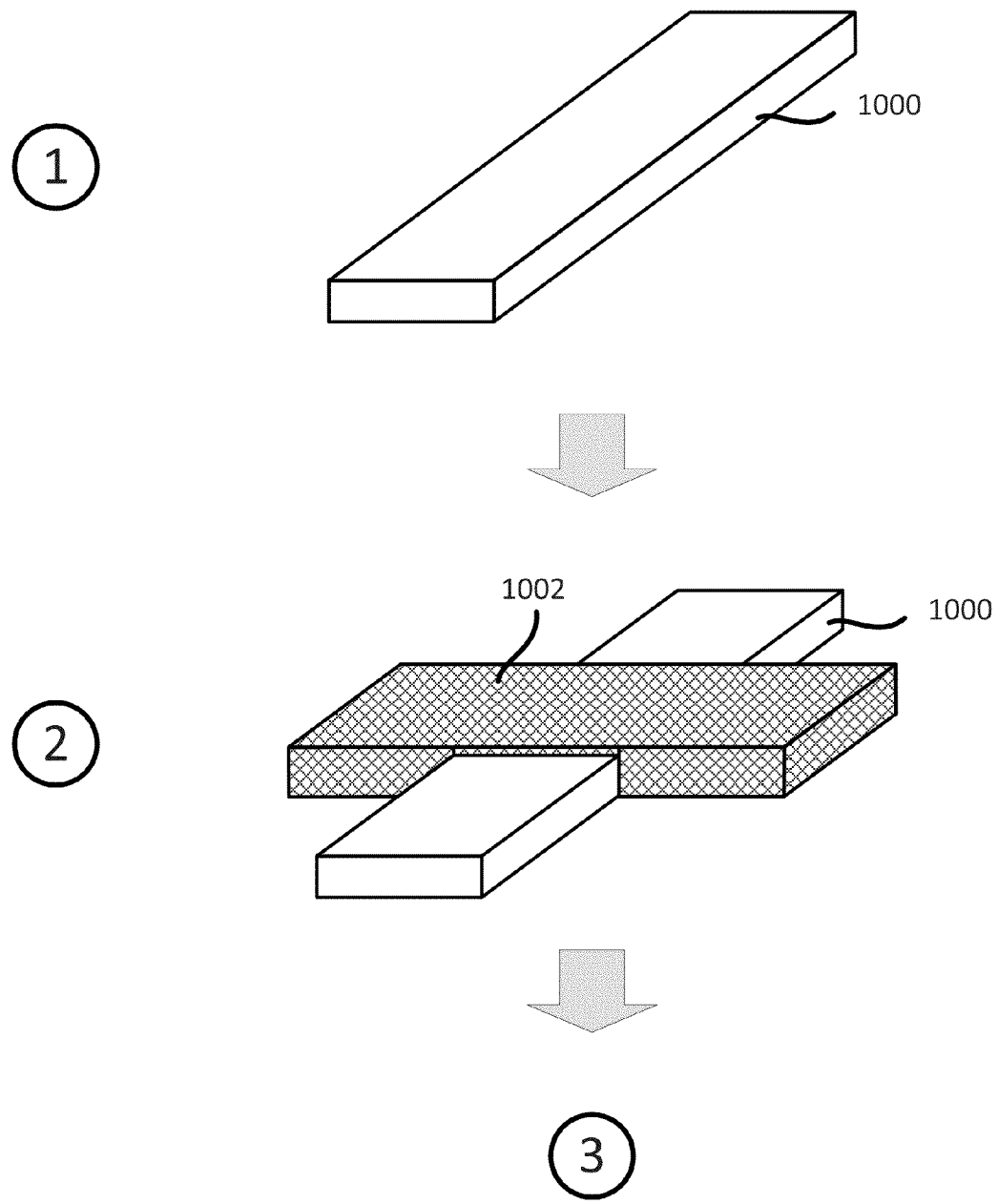
FIGS. 10A-10C illustrate a sequence for manufacturing a package that includes a thermal compression flip chip with bumps having a barrier layer.
Figure 10B:
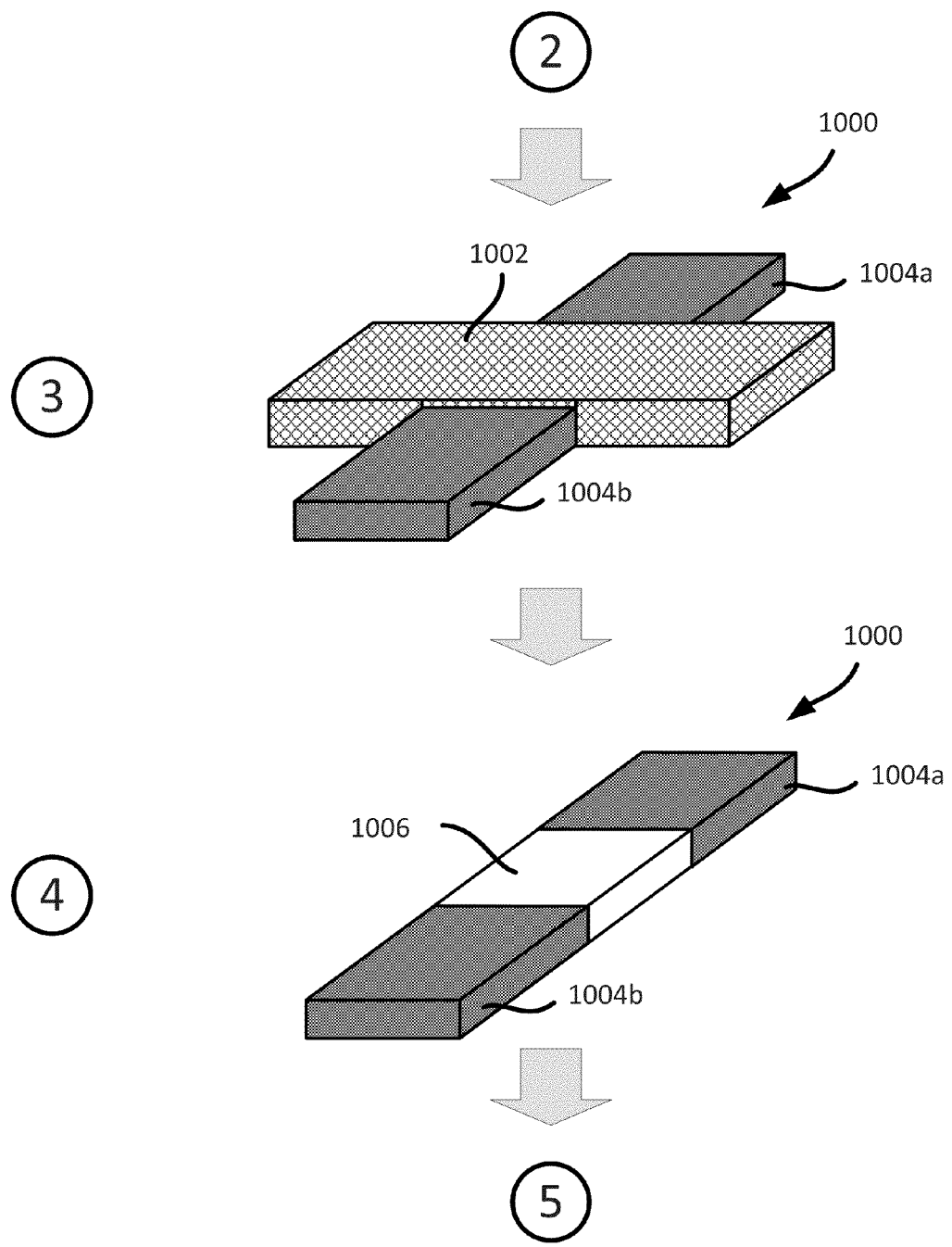
Figure 10C:
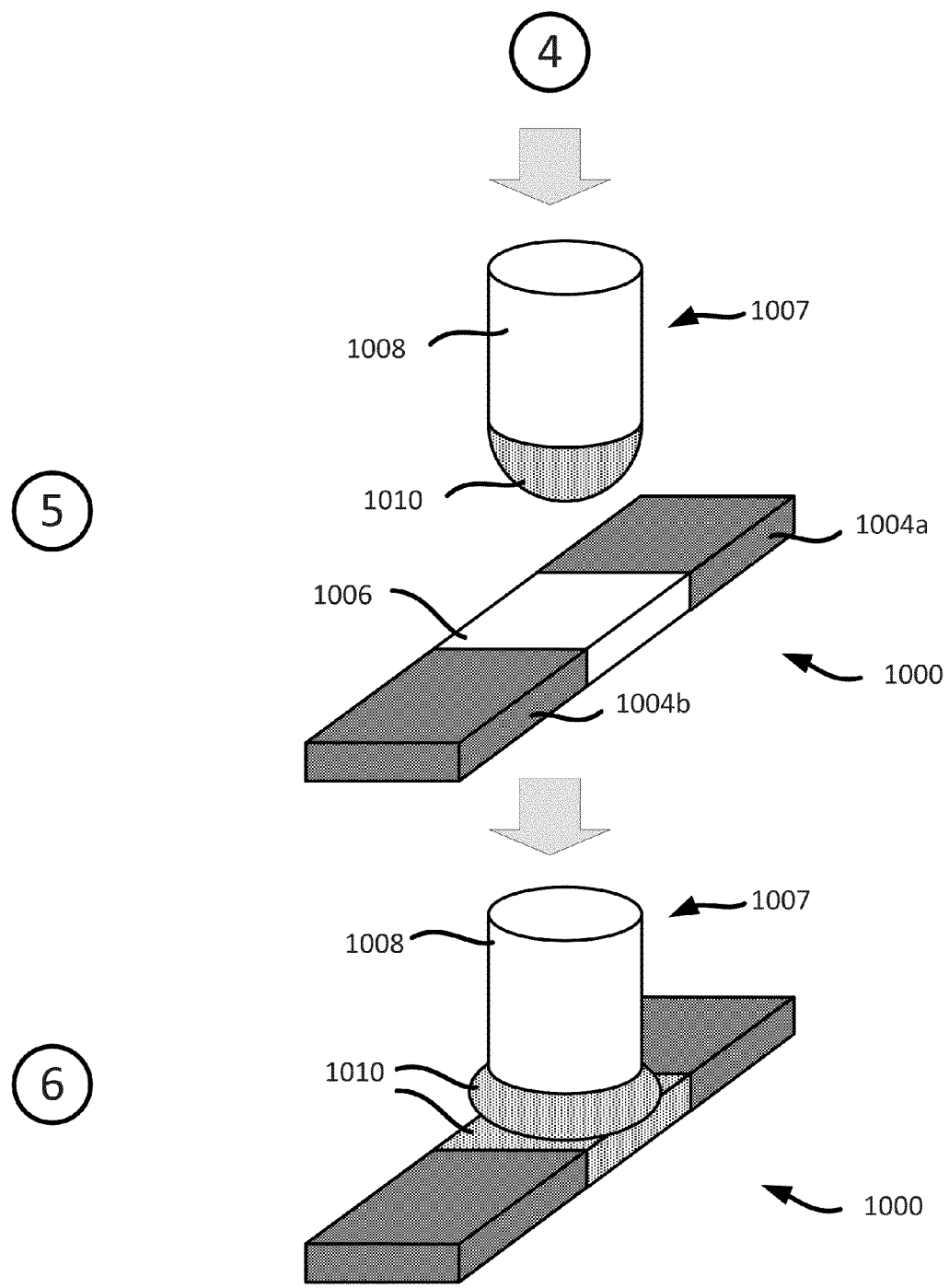

Exemplary Sequence for Coupling a UBM Structure and Solder to a Trace Coated/Oxidized with a Non-Wettable Layer FIGS. 10A-10C illustrate a sequence for coupling a UBM structure and solder to a trace coated with a non-wettable layer. It should be noted that for the purpose of clarity and simplification, the processes of FIGS. 10A-10C do not necessarily include all the steps and/or stages of manufacturing/coupling a die to a packaging substrate. Moreover, in some instances, several steps and/or stages may have been combined into a single step and/or stage in order to simplify the description of the processes. In addition, the components illustrates in the FIGS. 10A-10C are merely conceptual illustrations and unless otherwise explicitly stated, do not necessarily represent the actual and/or relative dimensions of these components. In some instances, some of the dimensions may have been exaggerated to clearly illustrate/distinguish features of some of the components.

Stage 1 of FIG. 10A illustrates a trace 1000. The trace 1000 may be a trace on a packaging substrate. In some implementations, the trace structure is a first interconnect means. For purpose of clarity and simplicity, only one trace is shown. Stage 2 illustrates a resist layer 1002 that has been applied to a portion of the trace 1000. The resist layer 1002 may be a dry film resist or a non-wettable polymer (e.g., polystyrene).

Stage 3 of FIG. 10B illustrates portions the trace 1000 that have been coated with a non-wettable material 1004a-b. Specifically, any portion of the trace 1000 that is not covered with a resist (e.g., resist 1002) is coated with a non-wettable material 1004a-b. In some implementations, the non-wettable material is an oxide layer/oxidized layer of copper. The oxidized layer of copper may be created by exposing the copper material of the trace to air, water, and/or other chemicals. This oxidized layer may be a non-wettable material since it may prevent solder from wetting to the trace. In some implementations, any portion of the trace 1000 that is not covered with a resist layer (e.g., resist 1002) may be plated with a particular material (e.g., nickel, chromium) and the material is oxidized (by exposing it to air, water and/or other chemicals), which creates an oxide/oxidized layer on the surface of the material.

Stage 4 of FIG. 10B illustrates the trace 1000 after the resist layer 1002 is removed from the trace 1000. As shown in Stage 4, removing the resist layer 1002 exposes the portion 1006 of the trace 1000 thereby allowing solder to be wetted to a particular portion of the trace 1000. Specifically, the solder would wet to the portion 1006 of the trace 1000. In some implementations, the coated/oxidized portions 1004a-b prevent excessive wetting of the solder on the trace, thereby reducing the likelihood of an open joint (e.g., gap) between a bump and a trace due to solder starvation.

Stage 5 of FIG. 10C illustrates a bump 1007 that includes an under bump metallization (UBM) structure 1008 and a solder 1010, being coupled to the trace 1000. In some implementations, the bump 1007 is aligned so as to couple to the portion 1006 of the trace 1000. Stage 6 illustrates the bump coupled to the trace 1000. More specifically, stage 6 illustrates the solder 1010 coupled to portion 1006 of the trace 1000. As shown in stage 6 of FIG. 10, the coated/oxidized portions 1004a-b prevent excessive wetting of the solder 1010 on the trace 1000, thereby reducing the likelihood of an open joint (e.g., gap) between a bump and a trace due to solder starvation and increasing the likelihood of a strong joint between the die and a packaging substrate in some implementations.

Figure 11:
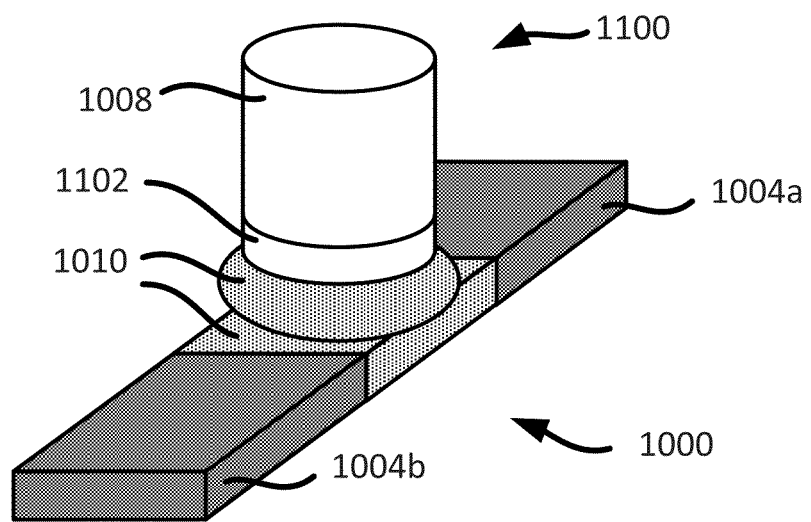
FIG. 11 illustrates a bump having a barrier layer coupled to a wettable portion of a trace.

In some implementations, the bump 1007 shown in FIG. 10C may include a barrier layer as described above with reference to FIGS. 4-6. FIG. 11 illustrates a bump 1100 that includes a UBM structure 1008 (e.g., first interconnect means), a barrier layer 1102 (e.g., second interconnect means and/or barrier means), and a solder 1010. The barrier layer 1102 may include a top portion, a bottom portion, and a side portion. The side portion may be partially, substantially, or completely oxidized (e.g., include an oxide/oxide layer). The barrier layer 1102 may be a metal layer that prevents solder from wetting the side of the UBM structure 1008 in some implementations. FIG. 11 also shows that portions of the trace 1000 (e.g., third interconnect means) has been coated/oxidized with an oxide/oxide layer (e.g., non-wettable layer 1004a-b). Thus, the solder 1010 is coupled/wetted to portion 1006 of the trace 1000. In some implementations, the combination of using a barrier layer on a die and the coating/oxidizing of a portion of the traces increases the likelihood of strong joints between a die and a packaging substrate.

Figure 12:
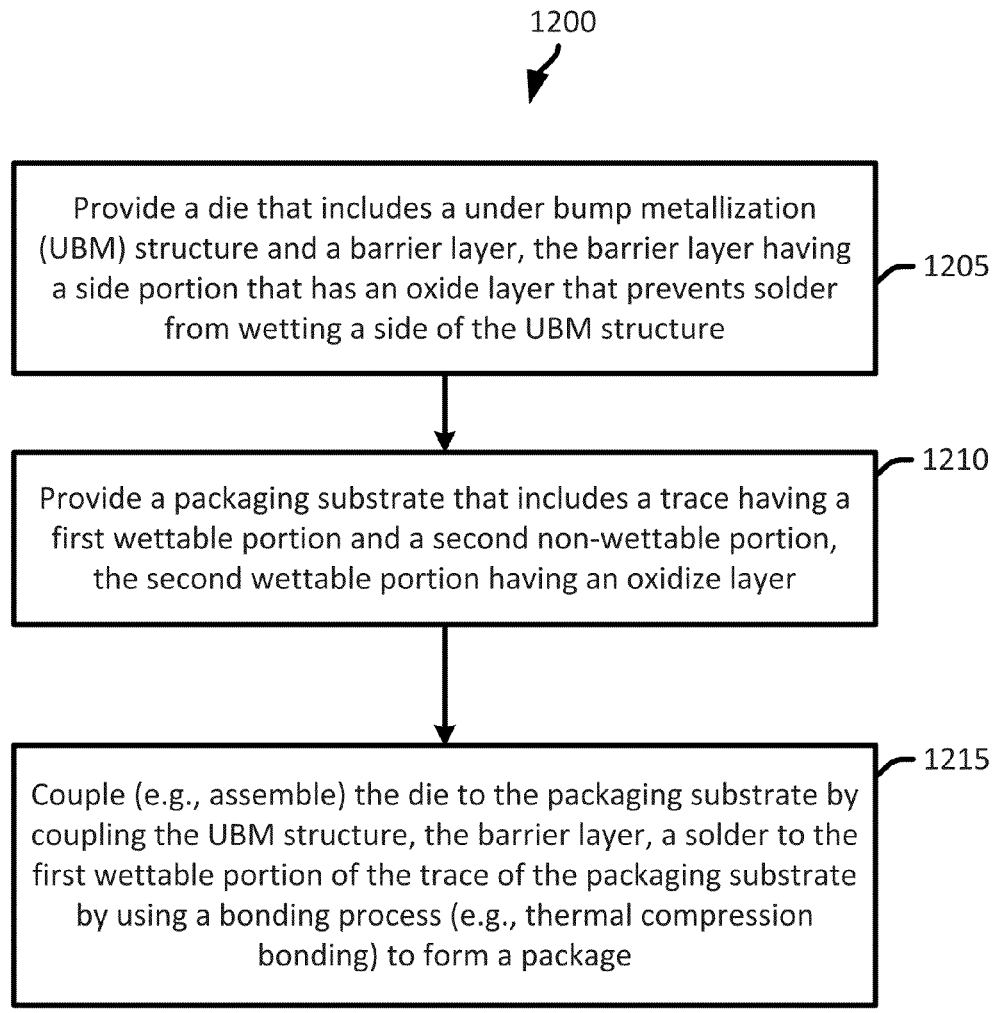
FIG. 12 illustrates a flow diagram of a detailed method for assembling a package that includes a thermal compression flip chip having bumps with a barrier layer coupled to a wettable portion of a trace of a packaging substrate.

Exemplary Method for Assembling Die to a Packaging Substrate Having a Trace with Non-Wettable Layer FIG. 12 illustrates a flow diagram of a method for assembling a die to a packaging substrate that has a trace with a non-wettable layer. As shown in FIG. 12, the method provides (at 1205) a die that includes at least one under bump metallization (UBM) structure. The UBM structure may be for example, the UBM structure 410 shown in FIG. 4. The UBM structure may be a copper pillar in some implementations. The die also includes a barrier layer, which is coupled to the UBM structure. In some implementations, each UBM structure may include a barrier layer. The barrier layer may be for example, barrier layer 412 of FIG. 4. The barrier layer may have a top portion, a bottom portion and a side portion. The top portion may be coupled to the UBM structure. The side portion may be partially, substantially, or completely oxidized (e.g., may have an oxide/oxide layer). The oxidized portion may prevent solder from wetting to a side of the UBM structure during an assembly process (e.g., during thermal compression bonding process) of a die to a substrate in some implementations.

Next, the method provides (at 1210) a packaging substrate that includes at least one trace. The traces may be made of a copper material. The packaging substrate may be for example, substrate 404 of FIG. 4. The trace may be for example, trace 1000 of FIGS. 10A-C. The trace may include a first wettable portion and a second non-wettable portion. In some implementations, the first wettable portion may be a portion of the trace that is partially, substantially, or completely free of any oxide/oxide layer. In some implementations, the second non-wettable portion may be coated/oxidized with a material that prevent solder from wetting to the trace. In some implementations, the second non-wettable portion may include an oxide layer.

After providing (at 1210) the packaging substrate, the method couples (at 1215) the die to the packaging substrate by coupling the UBM structure, the barrier layer, and a solder to the first wettable portion of trace of the packaging substrate and ends. The die may be coupled to the packaging substrate by using a thermal compression bonding procession in some implementations. The barrier layer is coupled to the UBM structure to prevent the solder from wetting the side of the UBM structure during the bonding process in some implementations. In some implementations, coupling the die to the packaging substrate includes coupling several UBM structures, barrier layers, and solders to several traces.

Exemplary Electronic Devices

Figure 13:
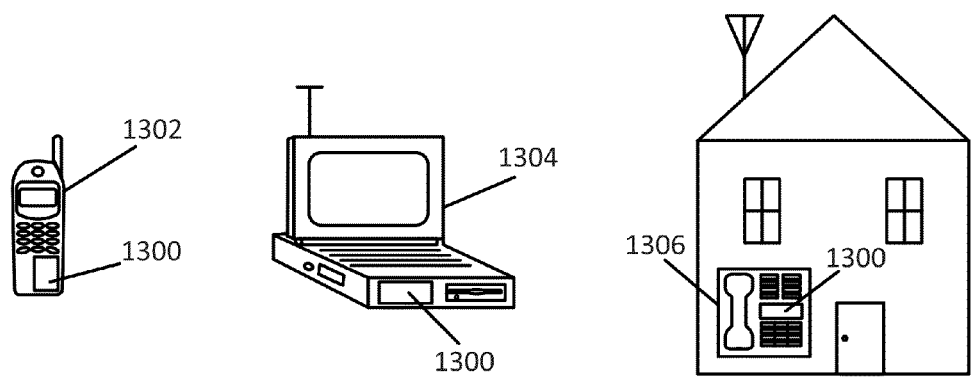
FIG. 13 illustrates various electronic devices that may integrate the IC described herein.

FIG. 13 illustrates various electronic devices that may be integrated with any of the aforementioned integrated circuit, die or package. For example, a mobile telephone 1302, a laptop computer 1304, and a fixed location terminal 1306 may include an integrated circuit (IC) 1300 as described herein. The IC 1300 may be, for example, any of the integrated circuits, dice or packages described herein. The devices 1302, 1304, 1306 illustrated in FIG. 13 are merely exemplary. Other electronic devices may also feature the IC 1300 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, the substrate of the die may be coupled to the packaging substrate even though the substrate of the die is never directly physically in contact with the packaging substrate.

The terms wafer and substrate may be used herein to include any structure having an exposed surface with which to form an integrated circuit (IC) according to aspects of the present disclosure. The term die may be used herein to include an IC. The term substrate is understood to include semiconductor wafers. The term substrate is also used to refer to semiconductor structures during fabrication, and may include other layers that have been fabricated thereupon. The term substrate includes doped and undoped semiconductors, epitaxial semiconductor layers supported by a base semiconductor, or semiconductor layers supported by an insulator, as well as other semiconductor structures well known to one skilled in the art. The term insulator is defined to include any material that is less electrically conductive than materials generally referred to as conductors by those skilled in the art. The term "horizontal" is defined as a plane substantially parallel to the conventional plane or surface of a wafer or substrate, regardless of the orientation of the wafer or substrate. The term "vertical" refers to a direction substantially perpendicular to the horizontal as defined above. Prepositions, such as "on," "upper," "side," "higher," "lower," "over," and "under" when used with respect to the integrated circuits described herein are defined with respect to the conventional plane or surface being on the top surface of the wafer or substrate, regardless of the orientation of the wafer or substrate. The prepositions "on," "upper," "side," "higher," "lower," "over," and "under" are thereby defined with respect to "horizontal" and "vertical."

One or more of the components, steps, features, and/or functions illustrated in FIGS. 4, 5, 6, 7, 8, 9, 10A-10B, 11, 12 and/or 13 may be rearranged and/or combined into a single component, step, feature or function or embodied in several components, steps, or functions. Additional elements, components, steps, and/or functions may also be added without departing from the invention.

Also, it is noted that the aspects of the present disclosure may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A semiconductor device comprising:
   a die;
   an under bump metallization (UBM) structure coupled to the die, the UBM structure having a first oxide property; and
   a barrier layer having a second oxide property that is more resistant to oxide removal from a flux material than the first oxide property of the UBM structure, the barrier layer comprising a top portion, a bottom portion and a side portion, the top portion coupled to the UBM structure, the side portion being substantially oxidized.

2. The semiconductor device of claim 1, wherein the barrier layer having the second oxide property that is more resistant to oxide removal from the flux material than the first oxide of the UBM structure and is configured to prevent a solder from spreading to a side of the UBM structure during an assembly process of the die to a substrate.

3. The semiconductor device of claim 1, wherein the barrier layer having the second oxide property that is more resistant to oxide removal from the flux material than the first oxide of the UBM structure and is configured to prevent joint starvation between a solder and a trace during an assembly process of the die to a substrate.

4. The semiconductor device of claim 1, wherein the first oxide property defines the oxide stability of the UBM structure, the second oxide property having a lower oxide stability than the first oxide property.

5. The semiconductor device of claim 1, wherein the UBM structure is a copper pillar.

6. The semiconductor device of claim 1, wherein the barrier layer is a nickel barrier layer.

7. The semiconductor device of claim 1, further comprising:
   a solder coupled to the barrier layer; and
   a trace coupled to the solder, the trace having a first wettable portion and a second oxidized portion, the first wettable portion being the first portion of the trace that the solder can wet onto, the second oxidized portion being coated with an oxide that is configured to prevent the solder from wetting to the second portion of the trace.

8. The semiconductor device of claim 1, wherein the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

9. A semiconductor device comprising:
   a die;
   a first interconnect means coupled to the die, the first interconnect means having a first oxide property; and a second interconnect means having a second oxide property that is more resistant to oxide removal from a flux material than the first oxide property of the first interconnect means, the second interconnect means comprising a top portion, a bottom portion and a side portion, the top portion coupled to the first interconnect means, the side portion being substantially oxidized.

10. The semiconductor device of claim 9, wherein the second interconnect means having the second oxide property that is more resistant to oxide removal from the flux material than the first oxide of the first interconnect means and is configured to prevent a solder from spreading to a side of the first interconnect means during an assembly process of the die to a substrate.

11. The semiconductor device of claim 9, wherein the second interconnect means having the second oxide property that is more resistant to oxide removal from the flux material than the first oxide of the first interconnect means and is configured to prevent joint starvation between a solder and a trace during an assembly process of the die to a substrate.

12. The semiconductor device of claim 9, wherein the first oxide property defines the oxide stability of the first interconnect means, the second oxide property having a lower oxide stability than the first oxide property.

13. The semiconductor device of claim 9, wherein the first interconnect means is a copper pillar.

14. The semiconductor device of claim 9, wherein the second interconnect means is a nickel barrier layer.

15. The semiconductor device of claim 9, further comprising:
   a solder coupled to the second interconnect means; and
   a third interconnect means coupled to the solder, the third interconnect means having a first wettable portion and a second oxidized portion, the first wettable portion being the first portion of the third interconnect means that the solder can wet onto, the second oxidized portion being coated with an oxide that is configured to prevent the solder from wetting to the second portion of the third interconnect means.

16. The semiconductor device of claim 9, wherein the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

17. A method for manufacturing a semiconductor device, comprising:
   providing a die;
   providing an under bump metallization (UBM) structure coupled to the die, the UBM structure having a first oxide property; and
   providing a barrier layer coupled to the UBM structure, the barrier layer having a second oxide property that is more resistant to oxide removal from a flux material than the first oxide property of the UBM structure, the barrier layer comprising a top portion, a bottom portion and a side portion, the top portion coupled to the UBM structure, the side portion being substantially oxidized.

18. The method of claim 17, wherein the barrier layer having the second oxide property that is more resistant to oxide removal from the flux material than the first oxide of the UBM structure and is configured to prevent a solder from spreading to a side of the UBM structure during an assembly process of the die to a substrate.

19. The method of claim 17, wherein the barrier layer having the second oxide property that is more resistant to oxide removal from the flux material than the first oxide of the UBM structure and configured to prevent joint starvation between a solder and a trace during an assembly process of the die to a substrate.

20. The method of claim 17, further comprising:
   providing a solder coupled to the barrier layer; and
   providing a trace coupled to the solder, the trace having a first wettable portion and a second oxidized portion, the first wettable portion being the first portion of the trace that the solder can wet onto, the second oxidized portion being coated with an oxide that is configured to prevent the solder from wetting to the second portion of the trace.

* * * * *